Jan. 13, 1959

R. C. CARLSON

DUAL DISC TURRET TUNER WITH CHASSIS CENTRALLY DISPOSED BETWEEN DISCS 2,868,985

Filed Aug. 15, 1955

3 Sheets-Sheet 1

INVENTOR.
REUBEN C. CARLSON

BY J. D. Douglas

HIS ATTORNEY

INVENTOR.
REUBEN C. CARLSON
BY
J. W. Douglas
HIS ATTORNEY

INVENTOR.
REUBEN C. CARLSON
BY J. D. Douglas
HIS ATTORNEY 2,868,985

DUAL DISC TURRET TUNER WITH CHASSIS CENTRALLY DISPOSED BETWEEN DISCS

Reuben C. Carlson, River Grove, Ill., assignor to Admiral Corporation, Chicago, Ill., a corporation of Delaware Application August 15, 1955, Serial No. 528,262

13 Claims. (Cl. 250—40)

This invention relates to apparatus for the reception of radio signals and more particularly to an improved tuner for the reception of television signals.

As is well known to those versed in the art, it is common practice to provide a tuning unit for use in television receivers, commonly known as a tuner, which may comprise a stage of radio frequency amplification and a combined oscillator and mixer. The radio frequency amplifier is designed to receive amplified signals as transmitted from the broadcasting station. These signals are transmitted on what is known as channels. The oscillator generates a local signal at a frequency displaced from the frequency of the received signal. The two signals are mixed in a mixer and the resultant signal, which is a heterodyne signal, usually always of the same frequency and containing all of the intelligence of the original signals, is utilized in the remaining portion of the receiver. In receiving signals on the different channels it is desirable to substitute in both the radio frequency and oscillator circuit inductances of different values, the values being determined by the frequencies of the signal to be received.

It is therefore apparent that certain components of the circuit such as the tubes, coupling capacitors and resistors and their associated wiring are of a fixed nature, whereas the inductances are variable in that different inductances may be selectively moved into position with the fixed circuitry to provide a complete useable circuit for any particular band.

Heretofore there have been several different types of tuners among which the most common are known as the switch and turret types. In the switch type tuner the inductances remain in a fixed position and a rotary switch is used to connect the inductances into the circuit. As will be appreciated this requires a relatively complicated series of connections which, particularly when high frequencies are involved, makes the design and manufacture relatively difficult. Although this type of tuner has the advantage of economy of construction it has the disadvantage in that it is difficult to repair and to maintain in operative condition.

In the turret type tuner the inductances are supported on a rotor or drum which is rotatable and selectively brings the desired inductances into contact with contacts which connect them to the fixed circuit elements. This has the advantage that the circuitry is simplified but has the disadvantage that the cost may frequently be greater, and, frequently contact trouble occurs which requires frequent servicing.

The turret type of turner has another disadvantage in that certain parts of the shielding which shields the radio frequency section from the oscillator section must necessarily be carried by the rotor. Since this shielding, in order to be effective, must be at ground potential, a good ground is necessary to the rotor. Being a rotatable part it is difficult as well as expensive to maintain an effective ground.

Even with the most effective grounding, a certain amount of interaction is realized between the components that are carried on the contact strips which is undesirable and cannot be easily eliminated.

A disadvantage inherent in both types resides in the fact that since there are so many contacts that have to be made simultaneously, it is difficult to change from one station to another due to frictional contact, requiring large and cumbersome control rods and knobs. This last item alone is particularly undesirable where certain types of remote or automatic tuning are to be used.

By the present invention there is provided a tuner which incorporates the advantages of both the turret and switch type tuner. It may utilize the advantages of the cheaper type of inductance found in the switch type tuner and the superior type of construction of the turret tuner due to the possibility of short leads. Because of its construction it is possible to lay out the circuits so that undesirable interaction between them is minimized. It is also possible to provide effective shielding between the parts without the shields requiring any moving contacts to effect grounding.

It has certain important advantages over both of the prior types peculiar to its own construction that are not present in the prior tuners.

Briefly, the invention comprises the provision of a small rectangular chassis which carries all of the fixed circuit components of the tuner relating to the radio frequency amplifier, oscillator and mixer stage and which components are connected to fixed contacts on opposite sides of the chassis. The movable or changeable components, i. e., the coils for the radio frequency amplifier and oscillator, are carried on separate discs which are supported for rotation by a shaft which in turn is supported by the chassis. The disc carrying the radio frequency inductance components is disposed on one side of the chassis and the disc carrying the oscillator inductance components is disposed on the other side of the chassis. By supporting the discs on opposite sides of the chassis, the fixed radio frequency components may be disposed on one end of the chassis and connected to the fixed contact carrying member on one side and adjacent one end while the fixed oscillator and mixer components are carried on the other end of the chassis and connected to a fixed contact carrying member on the other side and at the other end, the two fixed contact carrying members being diagonally opposite to each other. This structure assures that all of the high frequency carrying leads may be made very short and permits a simplified form of shielding between the radio frequency and oscillator sections. In addition the placement where the so called "hot" components are diagonally opposite each other reduces the interaction therebetween.

The fixed contact carrying elements carry the fixed contacts in a straight line. The discs that carry the movable elements, i. e., inductances, have the inductances disposed on one side and connections are brought from the inductances to rows of contacts on the other side, which rows extend in radial lines and are adapted to engage, with the fixed contacts when they are aligned therewith. Several advantages are gained from the foregoing described structure.

In a drum type of tuner, a certain amount of torque is required to be able to turn the drum. The amount of torque required is determined, among other things, by the distance that the contacts are spaced from the axis of the drum. The greater the radius the greater the turning torque required.

Figures 5, 6, 7, 8:
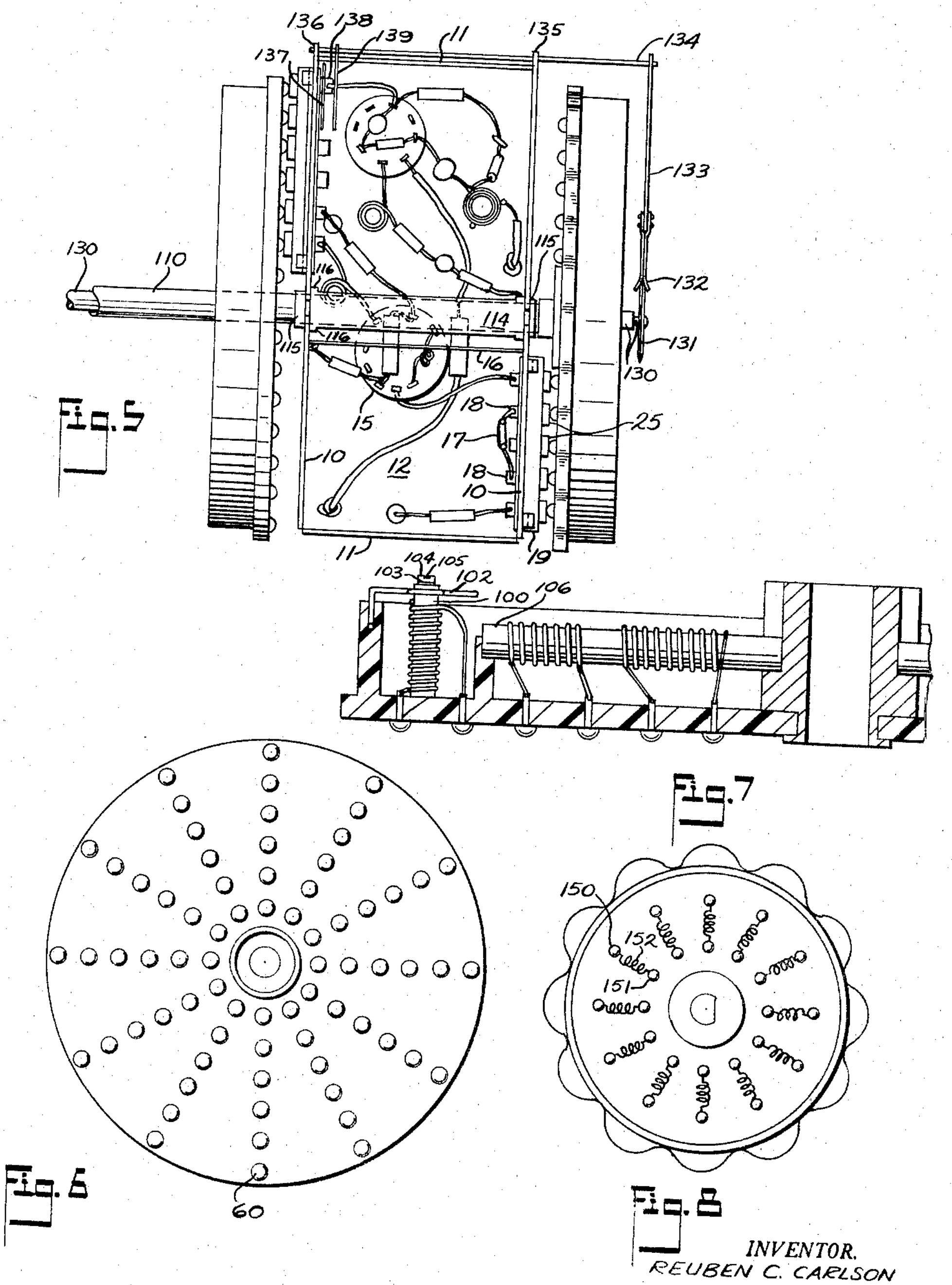
Fig. 5 is a bottom plan view of the tuner.
Fig. 6 is a view of the contact side of one of the inductance supports.
Fig. 7 is a sectional view of a modified form of oscillator disc.
Fig. 8 is a view of an inductance coupling disc carrying a different type of inductance.

As can be seen from Fig. 6, in this device the first contact is closely spaced to the turning axis and the other contacts are spaced outwardly. Therefore considerably less turning effort is required.

When the discs are rotated the innermost contacts, the ones nearest the center, will connect first with the fixed contacts. Because it is closely spaced from the axis it makes contact easily. As the rotation is continued to bring the remaining contacts into line with the fixed contacts, the contacts engage with the fixed contacts successively from the center outward. Thus although it may be necessary to establish as many as eleven or more contacts for switching from one band to the other, these contacts do not all make contact at the same time but do so successively which makes the tuner much easier to change from one station to the other.

Furthermore, since the discs are disposed on a shaft on either side of the housing carrying the fixed contacts, the contact pressure can be adjusted simply by moving the discs on the shafts toward the chassis. In the prior art the only way the contact pressure could be adjusted was by bending one or the other of the sets of contacts, usually the fixed contacts. If desired, sufficient end play of the shaft in its mounting in the chassis may be provided to provide an equalization of pressure between the contacts of one disc with the fixed contacts on one end of the chassis and the contacts of the other disc with the fixed contacts on the other end of the chassis thus preventing any undue pressure and excessive wear on any one set of contacts and increasing the life and effectiveness thereof.

Another important advantage of the construction resides in the fact that the discs lend themselves to their manufacture by printed circuit procedures and to their assembly by automation machines.

Still other advantages will be apparent as the description proceeds.

Figure 1:
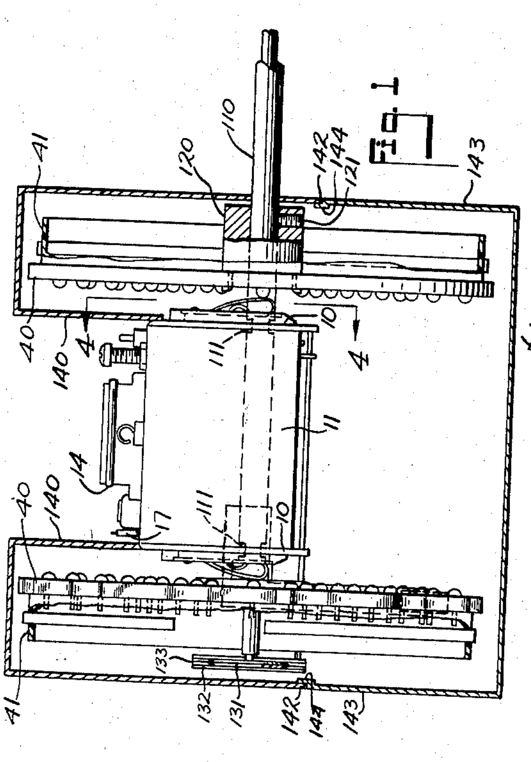
Fig. 1 is a side elevational view of an improved tuner of my invention with certain parts broken away.
Figure 4:
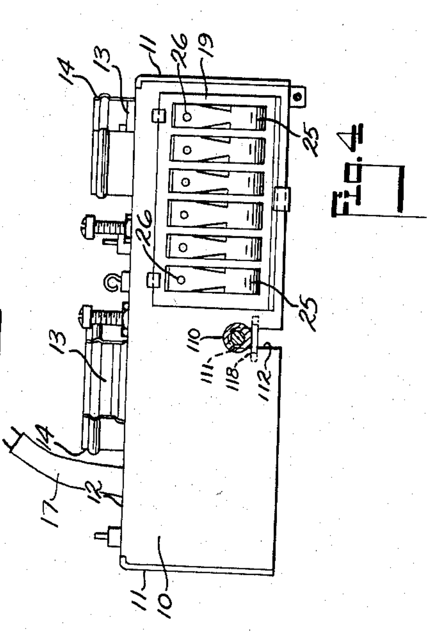
Fig. 4 is a view of the chassis taken from the line 4—4 of Fig. 1.

As best shown in Figs. 1, 4 and 5 there is provided a rectangular boxlike chassis including side walls 10, and end walls 11 and a top wall 12. Although the chassis is illustrated as being constructed as an integral unit it will be appreciated that it could be and preferably is made in one or more parts which may be interlocked with each other. This type of construction, in production, would facilitate the ease of wiring. The top of the chassis 12 supports one or more tube sockets 13 which are surrounded by shield supports 14. The sockets are adapted to receive vacuum tubes and the shield supports have a bead thereon for engagement of the shield of a vacuum tube not shown, as is well known in the art.

As can best be seen in Fig. 5 the fixed components of the radio frequency amplifier are disposed in one end of the chassis and the oscillator and mixer circuits are disposed in the other end of the chassis and in the opposite side. In this instance the radio frequency amplifier circuitry is shown in the lower end as viewed in the figure and the oscillator and mixer in the upper end. Again it will be appreciated that other types of circuits may be used. The tube socket 15 for the radio frequency amplifier is so positioned near the center of the chassis that the output terminals, which connect to the mixer stage, may be shielded from the high frequency end of the circuit by a shield 16 which extends transversely across the chassis between the walls 10, being effectively grounded thereto.

The antenna input to the tuner is through the usual transmission line, which, in this instance, is a 300 ohm line and the end of which is shown at 17, the leads being connected to terminals 18 which are carried by a block 19 secured exteriorly of the chassis opposite a rectangular opening in the chassis. This fixed contact block 19 is provided with a shoulder which seats in a rectangular opening in the side wall. The block may be inserted from the exterior of the chassis and is held in place by lugs integral with the side wall which are bent over to hold the block securely in place. This particular part of the construction is well known in the art. It should be pointed out that other types of construction could be provided, the main consideration being that the contacts project exteriorly of the chassis. The terminal block itself is provided with a plurality of openings. In this instance the radio frequency portion of the block has five openings while the oscillator mixer circuit block has six openings. Opposite these openings and extending into the openings are loop shaped fixed contacts 25 held in place by rivets 26. The end of the contacts extend through the blocks into the interior to provide solder lugs 18.

As can best be seen from Fig. 5, it will be noted that the fixed contact block which connects to the fixed radio frequency part of the circuit is disposed on one side of the chassis on one end while the block that carries the contacts for the oscillator, mixer and amplifier is disposed diagonally on the opposite side of the chassis at the other end.

As will be understood by those versed in the art, usually the only elements that require changing when shifting from one band to the other are the inductances. It is desirable that separate sets of inductances for the radio frequency amplifier and oscillator circuits be provided, each set being designed for a particular channel and arranged to be shiftable simultaneously into connection with their cooperating fixed circuits to provide a complete operative circuit.

The drawings illustrate the disc carrying the antenna or radio frequency amplifier inductances as being on the left side or rear of the tuner as viewed in Fig. 1 with the disc carrying the oscillator and mixer inductances as being on the right side or the front.

Preferably the body of each of the discs is made of an insulated material comprising a circular body 40 provided with a laterally extending flange 41 adjacent the periphery. One of the discs, which in this instance is the disc for the antenna circuitry, is provided with circumferentially spaced notches 42 each of which cooperates with a roller 43 carried on a spring arm 44 secured to one of the end walls 11 and which roller engages in the notches and indexes the disc in its proper position for engagement of a series of contacts on the discs with the fixed contacts on the chassis. Inasmuch as both discs are secured to the shaft, both discs are thus indexed to connect the desired inductances into the fixed parts of the circuit.

Figures 2, 3:
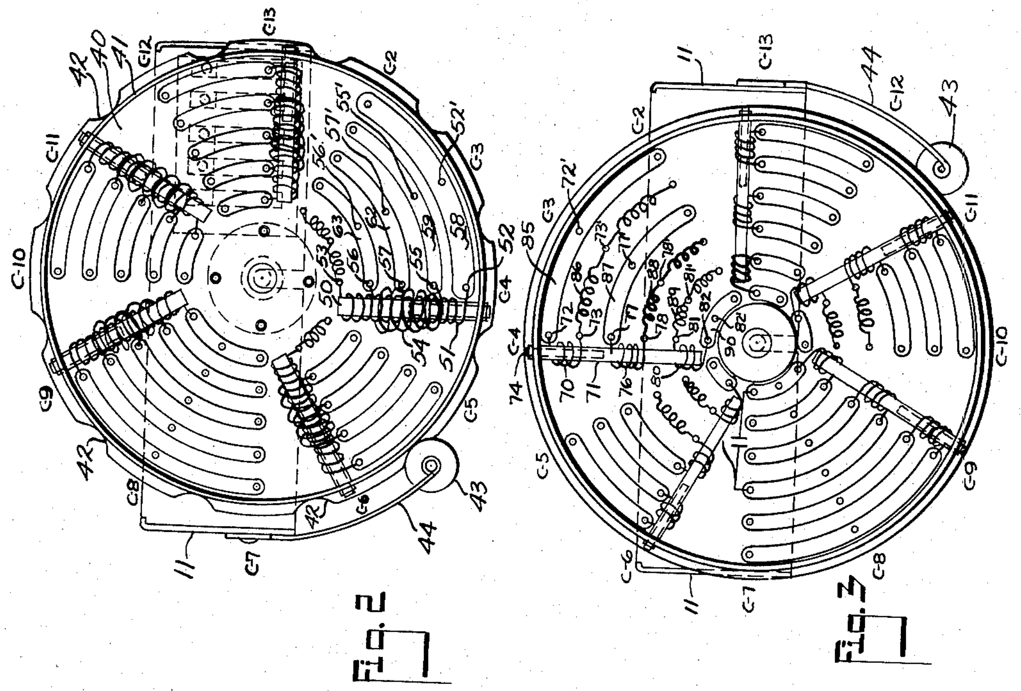
Fig. 2 is an end view of the tuner taken from the left end as viewed in Fig. 1, with the shield removed.
Fig. 3 is an end view from the opposite end.

The inductances carried by the discs may take various forms of which several are illustrated in the drawings. Those shown in Figs. 2 and 3 are what is known as incremental inductances. That is, the main inductance may have two continuations thereof which may be added in increments. The main inductance of a group being designed for a certain channel may have the increments added to the inductances to increase the total inductance and to include in some instances one or more additional channels. I contemplate however that discrete inductances may be provided for each channel as shown in Fig. 8. In either instance any type of inductance may be mounted upon the disc and the invention is not limited to the particular inductances shown.

As illustrated in Fig. 2 the main inductance for channel C4 may be wound on a coil form 50 and comprise a secondary 51 one end of which is secured to a contact 52 and the other end of which is secured to a contact 53.

The primary may comprise a center tapped inductance 54 the end taps connecting to the contacts 55 and 56 and the center tap to the contact 57.

The contacts may be in the form of hollow round head rivets the stems of which extend through the body of the disc with the heads 60 being disposed on the opposite sides from the coils and constituting the actual contact making portion. These contact elements may be inserted into apertures in the disc or be moulded into the disc during manufacture.

It will be noted that the contacts for any one channel, in this instance five, are aligned in a row which extends radially from the axis of the disc to a point spaced from the periphery.

It will be assumed that the parts just described provide a tuning element for channel C4. It will be noted that arcuate strips 58, 59, 62 and 63 connected from the contacts 52, 55, 57 and 56 respectively and extend to another series of contacts 52', 55', 57' and 56'. Thus the length of strip between the contacts 52 and 52' and likewise the other sections just described provide additional length to those portions of the circuit to which they are connected and which are included in the circuit when the tuner is shifted from channel C4 to channel C3, these strips providing sufficient additional inductance to tune the circuit to a lower frequency channel. In the case of the strip between channel 52 and 52' this strip may be made wider than the other strips to thus reduce the inductance even though it is longer. In any instance the width and length of the inductance determine the additional amount of inductances added to the circuit. It will be seen that these strips likewise continue to a third set of contacts which, in this case, would be the contacts for channel C2.

In some instances it is only desirable that two channels be incrementally connected. For instance, channels C12 and C13 are incrementally connected, channels C10 and C11 are incrementally connected and channels C7, C8 and C9 are incrementally connected.

The form such as 50 carrying the larger portion of the inductance may be secured to the discs in any desired manner, an air wound coil may be used and supported by the contact elements. In this instance, however, one end of the form is disposed in a notch in the flange 41 and the other end supported by its connection to the contact.

The oscillator disc involves the same considerations. In this instance however the disc may be slightly more complex since it normally will contain inductances for the oscillator circuit, the mixer circuit and an inductance for coupling from the antenna circuit to the mixer.

In the showing of Fig. 3 the oscillator disc coils are numbered to correspond with the numbering of that of Fig. 2. As appears in the figure these appear to be positioned in the opposite direction because they are on the other side of the chassis. In the case of channel C4 the oscillator coil 70 is shown wound on the form 71, one end connecting to the contact 72 and the other to the contact 73, this being the outermost coil. The coil is provided with the usual tuning slug 74 which may be threaded into the coil form to provide a fine adjustment for the oscillator for tracking purposes. The mixer circuit coil is disposed inwardly of the oscillator coil, being wound on the same form and includes the coil 76 connected to the contacts 77 and 78. The innermost coil 80 is the coil that is connected to the output of the antenna circuit and whereby the signals are fed to the mixer coil. It connects to the contacts 81 and 82. The oscillator contact 72 is connected by a strip 85 to the next adjacent contact 72'. The other end of the oscillator is connected by a wire wound inductance 86 to the next adjacent contact 73'. Likewise the next contact 77 is connected by a strip 87 to the next contact 77', the other end 78 being connected by the inductance 88 to the contact 78'. As for the band tuning coil 80, the contact 81 is connected to the contact 81' by an inductance 89. In this instance the end contact 82 is connected by a strip 90 to the contact 82'.

The foregoing shows how the fundamental circuit for channel 4 includes the main inductances and additional inductances are added by increments to tune the oscillator, mixer, and band to channel 3. For tuning to channel 2 additional strips and inductances may be added in a similar manner.

Preferably each of the oscillator coils is provided with a tuning slug. These are accessible from the periphery of the disc.

It frequently happens that it is desirable to be able to adjust the oscillator from the front of the television cabinet which is a conventional way of doing it today. In this instance, as shown in Fig. 7, the oscillator coil can be disposed at right angles to the other coil. One manner of supporting the coil is on a form 100 which which may be integral with the disc or inserted therein, the boss being provided with a slot in one end in which a wire C-spring 102 is disposed, the spring extending into the thread 103 of the tuning slug 104 which has a screw driver slot 105 for adjusting the same. The remaining coils in the circuit are disposed on a form 106 extending radially outward from the boss that supports the oscillator coil. By this construction the slug may be adjusted from the front of the receiver when the control shaft extends through the front of the receiver as is common practice. If desired the oscillator coil may be link coupled to the other coils or capacity coupled thereto.

The structure lends itself to many particular types of circuitry desired. The main desideratum being that there be a tunable antenna circuit, a mixer circuit and an oscillator circuit, the inductive components of which may be selectively engaged as desired.

Figure 9:
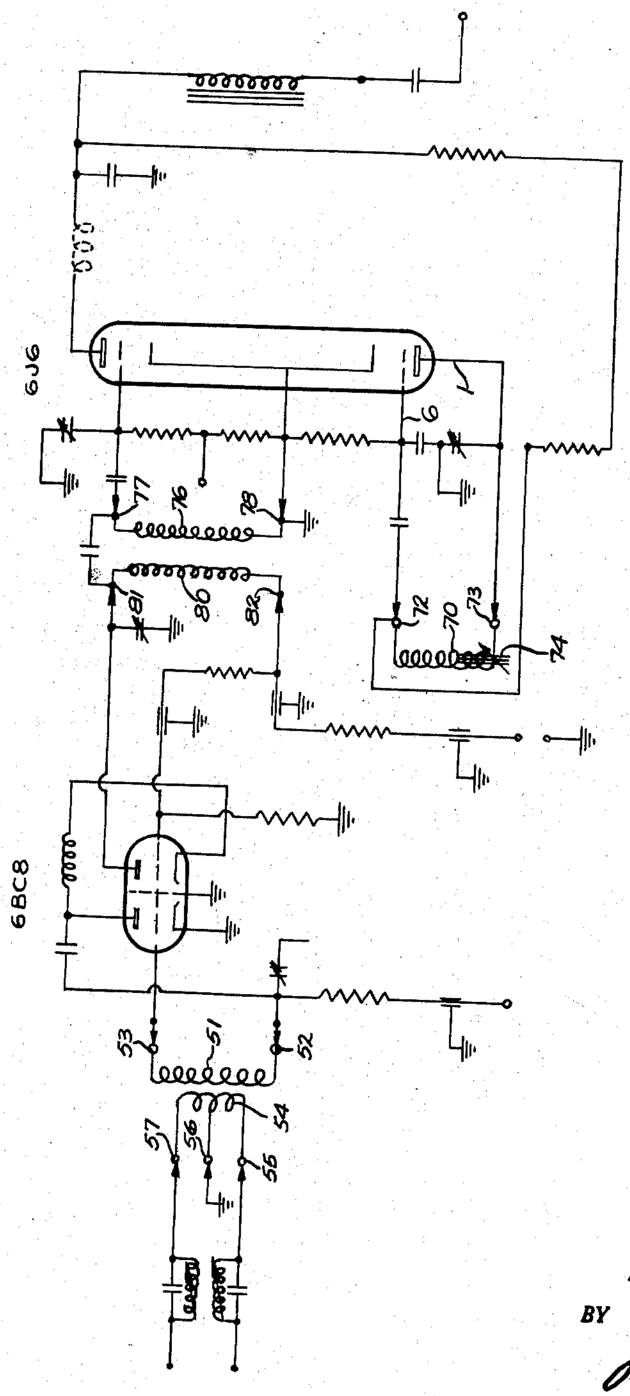
Fig. 9 is a schematic diagram of a circuit useful in the tuner of my invention.

Fig. 9 is a schematic diagram of a circuit useful with the tuner of the invention. If it be assumed that this particular circuit is tuned to channel C4 the primary 54 is inductively coupled to the secondary 51 which connects to the grid of the 6BC8 tube. The anode of this tube connects to the cathode of the second section of the tube and the anode of the second section of the tube is connected to the band coil 80 which is inductively coupled to the mixer coil 76. The oscillator coil 70 is also in inductive relation with the mixer coil. The oscillator includes the triode section including the grid 6 and anode 1 of the 6J6 tube, while the mixer includes the grid 5 and cathode 2 of that tube, the cathode being common to both circuits. The output connects through a peaking coil shown in dotted lines, to the primary of the first IF stage. As stated, the circuit diagram is shown merely for the purpose of disclosure of the usefulness of my invention in a tuner. Only one set of coils are shown on the diagram and the movable contacts are correspondingly numbered on the diagram.

The shaft for supporting the discs is a hollow sleeve 110 provided with a pair of grooves 111 which are spaced apart the same distance as the spacing of the channel walls 10 and adapted to seat in the bottom of slots 112 in each wall. When seated in the slots the shaft is held in position by a spring retainer which comprises a flexible leaf 114 having a tongue 115 on each end and a pair of lugs 116 extending laterally from the tongue. The tongues 115 engage in slots 118, on opposite sides of the shaft slot 112, the lugs engage the inner wall, the retainer forming an abutment for holding the shaft in position. Each of the discs is provided with hubs 120 which are held in position on the shaft by set screws 121. Preferably the shaft is made with flats for engagement with the set screws.

Several types of fine tuning controls may be provided, one of which is shown in Fig. 5, wherein a shaft 130 extends through the main shaft 110 and projects beyond the end of the rear disc and carries thereon a circular thin disc 131. The circular disc engages between the leaves 132 of a quadrant 133 carried by a shaft 134 journalled in the chassis walls at 135 and 136. The stator for the fine tuning control is illustrated at 137 as being connected to the lug 138 of the fixed contacts for the oscillator circuit. The rotor comprises a leaf 139 carried by the shaft 134 in closely spaced relation to the stator 137. Rotation of the shaft 130 rotates the wheel 131 and quadrant 137. This rotates the shaft 134 and the rotor 139 in a manner well known in the art. It will be appreciated that with this structure this same fine tuning control could be disposed on the front of the chassis if desired in which event a sleeve would be placed around a shaft 110.

The structure lends itself readily to complete shielding. In this case the upper part of the chassis is provided with separate shield portions 140 which, as shown, attach to the chassis, extend over and surround the shaft 110 on one side, the rear portion extending rearwardly in a similar manner. The two portions terminate in edges 142 arranged to be interlocked with a removable lower shield 143 having an offset flange 144 for engagement with the flanges 142.

Fig. 8 is an example of another type of antenna disc which is similar to that of Fig. 2 except that the inductances are discrete for each channel. In this case only two of the contacts 150 and 151 are used for each channel with the inner connecting inductance 152. This type of disc is useful in a tuner using the well known "balun" circuit.

It will be noted that the strips used for the incremental tuning as illustrated in Figs. 2 and 3 lend themselves ideally to their formation by the so-called "printed circuitry," of which there are many forms in the art.

It will therefore be seen that I have provided a tuner wherein the circuitry may be so disposed as to reduce the interaction between the various sections since the radio frequency portion is diagonally displaced from the oscillator and mixer section. It is particularly apparent that since the fixed contacts for these parts of the circuit are on diagonally opposite sides of the chassis that the metal body of the chassis, which is normally grounded, serves as a shield between the two inductance carrying discs. It is also apparent from the drawings that the structure lends itself to the components which decreases the losses due to stray fields and simplifies the construction. In addition, it lends itself to a simple and effective shielding between the parts of the circuit in the chassis itself.

Because the discs are provided with radially disposed contacts it will be apparent that they may be rotated easily and that the frictional resistance is reduced due to the proximity of some of the contacts to the turning axis of the shaft and due to the fact that no more than two contacts, and sometimes only one, are being made simultaneously. In addition, because the contacts are facing in opposite directions and the shaft is capable of a limited amount of end play the discs may be so positioned on the shaft that the pressure of the opposite contacts is equalized due to movement of the shaft. A very important feature resides in the fact that the discs may be adjusted longitudinally on the shaft and thus any desired degree of pressure realized which reduces the contact resistance and enables the movable contacts to better wipe the oxide from the both sets of contacts reducing the need for frequent cleaning as has heretofore been common.

It is also apparent that besides the economies of construction a tuner is provided which requires but a limited amount of space due to its small size. As illustrated in Fig. 8 the discs may be made much smaller in diameter than the drums of the prior art, should it be desired.

Having thus described my invention in some embodiments thereof which are shown for the purpose of illustrating and clarifying the invention rather than for the purposes of limiting the invention, I am aware that numerous and extensive departures will readily be apparent to those versed in the art and that the invention is only limited as stated in the appended claims.

I claim:

1. A television tuner comprising support means rotatable about an axis of rotation and including a pair of insulation supports spaced apart along said axis of rotation, tuning circuit components carried by said support means, a metal chassis positioned in the space between said insulation supports, fixed circuit components carried by the chassis, a first set of switch contacts carried by the chassis and facing outward in one direction at one side of the chassis in confronting relation to one of said insulation supports, a first plurality of switch contacts carried by said one insulation support and positioned to engage the contacts of said first set selectively depending upon the position to which said support means is turned, a second set of switch contacts carried by the chassis and facing outward in the opposite direction at the opposite side of the chassis in confronting relation to the other of said insulation supports, a second plurality of switch contacts carried by said other insulation support and positioned to engage the contacts of said second set selectively depending upon the position to which said support means is turned, connections from said fixed circuit components to said first and second sets of switch contacts, and connections from said tuning circuit components to said first and second plurality of switch contacts.

2. A television tuner comprising a metal chassis having spaced parallel side walls, fixed circuit components carried by the chassis between said side walls and including radio frequency amplifier components and oscillator and mixer components, a first set of switch contacts carried by one of the chassis side walls and exposed at the outer side of said wall toward one end of the chassis, connections from the radio frequency amplifier components to switch contacts of said first set, a second set of switch contacts carried by the other chassis side wall and exposed at the outer side of said other wall toward the opposite end of the chassis, connections from the oscillator components to switch contacts of said second set, a rotatable shaft extending perpendicularly through said chassis side walls and rotatably supported thereby between said first and second sets of switch contacts, a first insulation disc carried by said shaft and positioned in spaced confronting relation to the outer side of said one chassis side wall, a plurality of radio frequency amplifier inductance components carried by said first disc at the side of the first disc facing away from said one chassis side wall, a plurality of switch contacts on said first disc projecting toward said one chassis side wall positioned to engage the contacts of said first set selectively depending upon the angular position of the shaft, connections from said radio frequency amplifier inductance components to said contacts on said first disc, a second insulation disc carried by the shaft and positioned in spaced confronting relation the outer side of said other chassis side wall, a plurality of oscillator inductance components carried by said second disc at the side of the second disc facing away from said other chassis side wall, a plurality of switch contacts on said second disc projecting toward said other chassis side wall and positioned to engage the contacts of said second set selectively depending upon the angular position of the shaft, and connections from said oscillator inductance components to said switch contacts on said second disc.

3. A television tuner comprising a chassis having a pair of spaced walls, a shield extending across the chassis between said side walls, a first set of switch contacts carried by one of said chassis side walls at one side of the shield and coupled to the antenna input line, the contacts of said first set presenting contact surfaces which are exposed at the outer face of said one chassis side wall, oscillator components supported on the chassis at the other side of said shield, a second set of switch contacts carried by the other of said chassis side walls at said other side of the shield and having connections to said oscillator components, the contacts of said second set presenting contact surfaces which are exposed at the outer face of said other chassis side wall, support means rotatable with respect to the chassis and including a pair of axially spaced support walls movable respectively across the outer faces of said chassis side walls in closely spaced relation thereto upon turning of said support means, a plurality of channel selector components carried by said support means, a first plurality of switch contacts carried by the support wall which moves across said one side wall of the chassis, said first plurality of switch contacts having connections to said channel selector components and being positioned selectively in engagement with the contacts of said first set depending upon the angular position to which said support means is turned, a plurality of oscillator tuning components carried by said support means, a second plurality of switch contacts carried by the other support wall which moves across said other side wall of the chassis, and said second plurality of switch contacts having connections to said oscillator tuning components and being positioned selectively in engagement with the contacts of said second set depending upon the angular position to which said support means is turned.

4. A television tuner comprising a chassis having a pair of spaced side walls, a shield extending across the chassis between said side walls, radio frequency amplifier components supported on the chassis between said side walls at one side of said shield, a first set of switch contacts carried by one of said chassis side walls at said one side of the shield and having connections to said radio frequency amplifier components, the contacts of said first set presenting contact surfaces which are exposed at the outer face of said one chassis side wall, oscillator and mixer components supported on the chassis between said side walls at the other side of said shield and connected in circuit with said radio frequency amplifier components, a second set of switch contacts carried by the other of said chassis side walls at said other side of the shield and having connections to said oscillator components, the contacts of said second set presenting contact surfaces which are exposed at the outer face of said other chassis side wall, support means rotatable with respect to the chassis and including a pair of axially spaced support walls movable respectively across the outer faces of said chassis side walls in closely spaced relation thereto upon turning of said support means, a plurality of radio frequency amplifier inductances carried by the support wall which is movable across said one chassis side wall, said inductances being disposed at the side of said support wall which is remote from said one chassis side wall, a first plurality of switch contacts carried by said support wall and projecting from said support wall toward said one side wall of the chassis, said first plurality of switch contacts having connections to said radio frequency amplifier inductances and being positioned selectively in engagement with the contacts of said first set depending upon the angular position to which said support means is turned, a plurality of oscillator inductances carried by the other of said support walls, a second plurality of switch contacts carried by said other support wall and projecting from said other support wall toward said other side wall of the chassis, and said second plurality of switch contacts having connections to said oscillator inductances and being positioned selectively in engagement with the contacts of said second set depending upon the angular position to which said support means is turned.

5. A television tuner comprising a chassis having a pair of spaced parallel side walls, a shield extending across the chassis between said side walls, radio frequency amplifier components supported on the chassis between said side walls at one side of said shield, a first set of switch contacts supported by one of said chassis side walls at said one side of said shield and projecting outward from said chassis side wall, connections from said radio frequency amplifier components to the switch contacts of said first set, oscillator and mixer components supported by the chassis between said side walls at the other side of said shield and connected in circuit with said radio frequency amplifier components, a second set of switch contacts supported by the other of said chassis side walls at said other side of the shield and projecting outward from said other chassis side wall, connections from said oscillator components to the switch contacts of said second set, support means rotatable with respect to the chassis and including support walls disposed respectively at the outer sides of said chassis side walls in closely spaced, confronting, parallel relation thereto and movable across said chassis side walls upon turning of said supports means, a plurality of radio frequency amplifier inductances carried by the support wall which is in confronting relation to said one chassis side wall, a first plurality of switch contacts carried by said support wall and projecting therefrom inward toward said one chassis side wall for engagement selectively with the contacts of said first set depending upon the angular position of said support means, connections from said first plurality of contacts to said radio frequency inductances, a plurality of oscillator inductances carried by the other of said support walls, a second plurality of switch contacts carried by said other support wall and projecting therefrom inward toward said other chassis side wall for engagement selectively with the contacts of said second set depending upon the angular position of said support means, and connections from said oscillator inductances to said second plurality of contacts.

6. The tuner of claim 5, wherein said support means includes a shaft supported rotatably by said chassis side walls and extending substantially perpendicular thereto and carrying said support walls, each of said support walls is adjustable along the shaft to vary the contact pressure between its contacts and the contacts at the confronting chassis side wall, and the shaft is adjustable longitudinally with respect to the chassis.

7. A television tuner comprising a metal chassis having spaced parallel side walls, a tuning shaft rotatably supported by said chassis side walls and extending perpendicular thereto, a shield extending across the chassis between said side walls, radio frequency amplifier components supported on the chassis between said side walls at one side of the shield, a first set of switch contacts supported by one of the chassis side walls at said one side of the shield and projecting beyond the outer face of said one side wall along a line radially outward from the shaft, connections from said radio frequency amplifier components to the switch contacts of said first set, a first insulation disc carried by said shaft and extending in closely spaced, confronting, parallel relation to said outer face of said one chassis side wall, a plurality of groups of switch contacts supported on the face of the disc which is in confronting relation to said one chassis side wall with the contacts in each group being aligned radially outward from the shaft and with the respective groups of contacts being spaced apart angularly about the shaft for engagement in succession as a group with the contacts of said first set upon rotation of the shaft, a plurality of radio frequency amplifier inductances supported at the opposite face of said disc and connected to the contacts on said one face of the disc, oscillator and tuner components supported on the chassis between said side walls at the other side of the shield, a second set of switch contacts supported by the other chassis side wall at said other side of the shield and projecting beyond the outer face of said other chassis side wall, connections from said oscillator components to the switch contacts of the second set, a second insulation disc carried by the shaft and extending in closely spaced, confronting, parallel relation to said outer face of said other chassis side wall, a plurality of groups of switch contacts supported on the face of said second disc which is in confronting relation to said other chassis side wall with the contacts in each group being aligned radially outward from the shaft and with the respective groups of contacts being spaced apart angularly about the shaft for engagement in succession as a group with the contacts of said second set upon rotation of the shaft and a plurality of oscillator inductances supported at the opposite face of said second disc and connected to the contacts on said one face of the second disc.

8. A television tuner comprising a metal chassis having spaced parallel side walls, a tuning shaft rotatably supported by said chassis side walls and extending perpendicular thereto, a shield extending across the chassis between said side walls, radio frequency amplifier components supported on the chassis between said side walls at one side of the shield, a first set of switch contacts supported by one of the chassis side walls at said one side of the shield and projecting beyond the outer face of said one side wall along a line radially outward from the shaft, connections from said radio frequency amplifier components to the switch contacts of said first set, a first insulation disc carried by said shaft and extending in closely spaced, confronting, parallel relation to said outer face of said one chassis side wall, a plurality of groups of switch contacts supported at the face of the disc which is in confronting relation to said one chassis side wall with the contacts in each group being spaced apart radially outward from the shaft and with the respective groups of contacts being spaced apart angularly about the shaft for engagement in succession as a group with the contacts of said first set upon rotation of the shaft, a plurality of main radio frequency amplifier inductances supported at the opposite face of said disc, each of said main inductances being connected between a pair of radially spaced contacts in a particular group on said one face of said disc, a plurality of incremental inductances supported at said opposite face of the disc and each connected between one of said pair of contacts in a particular group and the contact in the next group which is positioned at the same radial distance from the shaft, oscillator and tuner components supported on the chassis between said side walls at the other side of the shield, a second set of switch contacts supported by the other chassis side wall at said other side of the shield and projecting beyond the outer face of said other chassis side wall, connections from said oscillator components to the switch contacts of the second set, a second insulation disc carried by the shaft and extending in closely spaced, confronting, parallel relation to said outer face of said other chassis side wall, a plurality of groups of switch contacts supported at the face of said second disc which is in confronting relation to said other chassis side wall with the contacts in each group being spaced apart radially outward from the shaft and with the respective groups of contacts being spaced apart angularly about the shaft for engagement in succession as a group with the contacts of said second set upon rotation of the shaft, a plurality of main oscillator inductances supported at the opposite face of said second disc, each of said main oscillator inductances being connected between a pair of radially spaced contacts in a particular group on said one face of said second disc, and a plurality of incremental inductances supported at said opposite face of said second disc and each connected between one of said pair of contacts in a particular group on said second disc and the contact in the next group on said second disc which is positioned at the same radial distance from the shaft.

9. The tuner of claim 8, wherein there are provided a plurality of tubular insulator supports carried by said second disc and extending outward from said opposite face thereof substantially parallel to the shaft, tuning coils wound around said tubular supports and having connections to contacts on said second disc, and tuning slugs received lengthwise in said tubular supports and adjustable lengthwise from their respective outer ends.

10. In a television tuner, the combination of a chassis, fixed circuit components on the chassis, a plurality of aligned switch contacts supported by the chassis and having connections to the fixed circuit components, an insulation support mounted for rotation with respect to the chassis, a plurality of groups of switch contacts on said insulation support with the contacts in each group being spaced radially from the rotational axis of said support and with the respective groups of radially spaced contacts being positioned for engagement in succession as a group with the contacts supported by the chassis upon rotation of said support, a plurality of main tuning elements carried by said insulation support, each of said main tuning elements being connected between a pair of radially spaced contacts in a particular group, and a plurality of incremental tuning elements carried by said insulation support and each connected between one of said pair of contacts in a particular group and the correspondingly radially positioned contact in another group.

11. In a television tuner, the combination of a metal chassis having a side wall, fixed circuit components on the chassis, a shaft rotatably mounted in said chassis side wall and extending substantially perpendicular thereto, a plurality of switch contacts supported on said chassis side wall and projecting at one side of said chassis side wall along a line radially outward from the shaft, an insulation disc carried by said shaft and extending in closely spaced, confronting, substantially parallel relation to said chassis side wall at said one side thereof, a plurality of groups of switch contacts supported on the face of the disc which is in confronting relation to said chassis side wall with the separate contacts in each group being spaced apart radially outward from the shaft end with the respective groups of contacts being spaced apart angularly about the shaft for engagement in succession as a group with the contacts supported by said chassis side wall upon rotation of the shaft, a plurality of main tuning inductances supported on the opposite face of the disc, each of said main tuning inductances being connected between a pair of radially spaced contacts in a particular group on said one face of the disc, and a plurality of incremental tuning inductances supported on said opposite face of the disc and each connected between one of said pair of contacts in a particular group and the correspondingly radially positioned contact in the next group of contacts on the disc.

12. The tuner of claim 11, wherein certain of said incremental inductances are composed of flat metal strips on said opposite face of the disc.

13. A television tuner comprising a metal chassis having spaced parallel side walls, fixed circuit components carried by the chassis between said side walls and including radio frequency amplifier components and oscillator and mixer components, a first set of switch contacts carried by one of the chassis side walls and exposed at the outer side of said wall, connections from the radio frequency amplifier components to switch contacts of said first set, a second set of switch contacts carried by the other chassis side wall and exposed at the outer side of said other wall, connections from the oscillator components to switch contacts of said second set, said chassis being provided with a shield separating the radio frequency amplifier components from the oscillator and mixer components, said first and second sets of contacts being disposed respectively on opposite sides of said shield, a rotatable shaft extending perpendicularly through said chassis side walls and rotatably supported thereby, a first insulation disc carried by said shaft and positioned in spaced confronting relation to the outer side of said one chassis side wall, a plurality of radio frequency amplifier inductance components carried by said first disc at the side of the first disc facing away from said one chassis side wall, a plurality of switch contacts on said first disc projecting toward said one chassis side wall positioned to engage the contacts of said first set selectively depending upon the angular position of the shaft, connections from said radio frequency amplifier inductance components to said contacts on said first disc, a second insulation disc carried by the shaft and positioned in spaced confronting relation to the outer side of said other chassis side wall, a plurality of oscillator inductance components carried by said second disc at the side of the second disc facing away from said other chassis side wall, a plurality of switch contacts on said second disc projecting toward said other chassis side wall and positioned to engage the contacts of said second set selectively depending upon the angular position of the shaft, and connections from said oscillator inductance components to said switch contacts on said second disc.

References Cited in the file of this patent

UNITED STATES PATENTS

| | | |
|---|---|---|
| 2,026,661 | Trevor | Jan. 7, 1936 |
| 2,551,228 | Achenbach | May 1, 1951 |
| 2,643,361 | Mackey | June 23, 1953 |
| 2,668,235 | Nordby | Feb. 2, 1954 |
| 2,672,592 | MacCheyne | Mar. 16, 1954 |
| 2,682,645 | Patla | June 29, 1954 |
| 2,774,880 | Fulmer | Dec. 18, 1956 |
| 2,786,142 | Tyminski | Mar. 19, 1957 |

FOREIGN PATENTS

| | | |
|---|---|---|
| 500,448 | Germany | June 20, 1930 |